US009939482B2

(12) United States Patent
Flay

(10) Patent No.: US 9,939,482 B2
(45) Date of Patent: Apr. 10, 2018

(54) METHOD AND APPARATUS FOR PROVIDING EARLY WARNING OF EXTRACTION OF MODULE UNDER POWER

(71) Applicant: Honeywell International Inc., Morristown, NJ (US)

(72) Inventor: Dustin Flay, Spring City, PA (US)

(73) Assignee: Honeywell International Inc., Morris Plains, NJ (US)

(*) Notice: Subject to any disclaimer, the term of this patent is extended or adjusted under 35 U.S.C. 154(b) by 265 days.

(21) Appl. No.: 14/577,521

(22) Filed: Dec. 19, 2014

(65) Prior Publication Data
US 2016/0116521 A1 Apr. 28, 2016

Related U.S. Application Data

(60) Provisional application No. 62/068,922, filed on Oct. 27, 2014.

(51) Int. Cl.
G06F 13/40 (2006.01)
G01R 31/04 (2006.01)
G06F 1/18 (2006.01)

(52) U.S. Cl.
CPC ........ G01R 31/045 (2013.01); *H01R 2201/20* (2013.01)

(58) Field of Classification Search
CPC ........ G06F 13/40; G06F 1/189; G01R 13/045
See application file for complete search history.

(56) References Cited

U.S. PATENT DOCUMENTS 5,589,719 A * 12/1996 Fiset .................. G06F 11/004
307/131
5,636,347 A * 6/1997 Muchnick ........... G06F 13/4072
710/302
5,754,797 A * 5/1998 Takahashi .......... G06F 13/4081
361/58

(Continued)

FOREIGN PATENT DOCUMENTS

KR 10-2010-0111290 10/2010

OTHER PUBLICATIONS

IBM, Soft-Stop Circuit permits Hot-Unplugging of Boards, Aug. 1, 1994, IBM Technical Disclosure, NN9408241.*

(Continued)

*Primary Examiner* — Henry Tsai
*Assistant Examiner* — Christopher A Daley

(57) ABSTRACT

An apparatus includes a connector configured to be electrically coupled to electrical circuitry. The connector has multiple pins, including one or more first pins and one or more second pins. The one or more second pins longer than the one or more first pins. The apparatus also includes a signal generator configured to detect disconnection of the one or more first pins prior to disconnection of the one or more second pins and generate a signal in response to detecting the disconnection of the one or more first pins. The connector could also include one or more third pins longer than the one or more second pins. The first pin(s) can create an electrical path from the signal generator to ground, the second pin(s) can provide a supply voltage to the electrical circuitry, and the third pin(s) can electrically couple the electrical circuitry to ground.

21 Claims, 14 Drawing Sheets

(56) References Cited

U.S. PATENT DOCUMENTS

| | | | | |
|---|---|---|---|---|
| 5,881,251 A * | 3/1999 | Fung | ............... | H02H 9/004 307/147 |
| 5,983,298 A * | 11/1999 | Schultz | ............... | G06F 13/4081 439/43 |
| 6,289,407 B1 * | 9/2001 | Yamada | ............... | G06F 1/189 361/58 |
| 6,528,904 B1 * | 3/2003 | Wong | ............... | G06F 13/4081 307/119 |
| 6,728,811 B2 * | 4/2004 | Yamada | ............... | G06F 13/4081 710/300 |
| 7,503,501 B2 * | 3/2009 | Jeong | ............... | G06F 11/3031 235/487 |
| 7,686,220 B2 * | 3/2010 | Hsu | ............... | G06F 13/385 235/441 |
| 7,814,255 B1 * | 10/2010 | Deva | ............... | G06F 13/4081 710/10 |
| 7,840,738 B2 | 11/2010 | Boer et al. | | |
| 7,856,515 B2 * | 12/2010 | Kim | ............... | G09G 5/006 710/17 |
| 7,970,973 B2 * | 6/2011 | Fang | ............... | G06F 13/4081 439/173 |
| 8,625,029 B2 * | 1/2014 | Doyle | ............... | G09G 5/006 348/461 |
| 2006/0007620 A1 | 1/2006 | Ochi | | |
| 2006/0146504 A1 * | 7/2006 | Belson | ............... | G06F 1/189 361/728 |
| 2009/0077270 A1 | 3/2009 | Chen et al. | | |
| 2009/0267613 A1 * | 10/2009 | Terlizzi | ............... | H04L 27/32 324/538 |
| 2011/0298466 A1 * | 12/2011 | Hein | ............... | B60L 3/0023 324/508 |
| 2012/0094507 A1 * | 4/2012 | Wu | ............... | H01R 12/718 439/65 |
| 2013/0072070 A1 * | 3/2013 | Tsai | ............... | G06F 1/189 439/660 |
| 2015/0205337 A1 * | 7/2015 | Zhao | ............... | G06F 13/4068 713/330 |

OTHER PUBLICATIONS

International Search Report and Written Opinion issued for PCT/US2015/057109 dated Jan. 28, 2016, 12 pgs.

Foreign Communication from a Related Counterpart Application, PCT Application No. PCT/US2015/057109, Notification Concerning Transmittal of International Preliminary Report on Patentablility dated May 11, 2017, 9 pages.

* cited by examiner

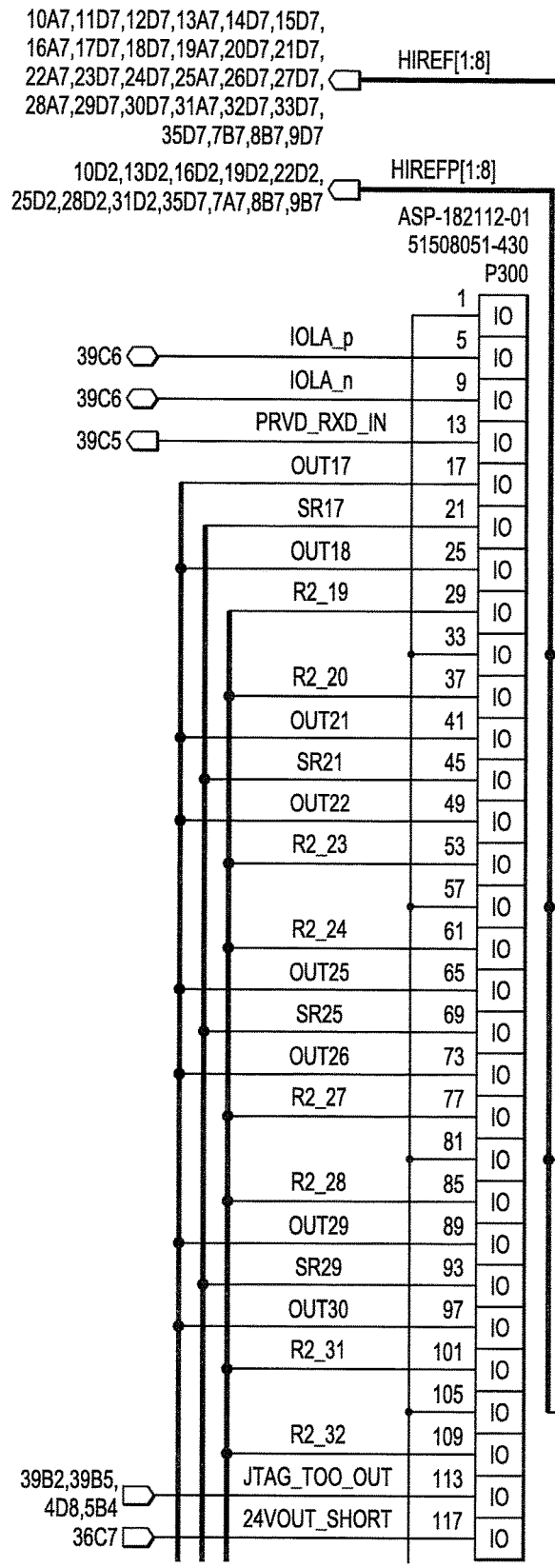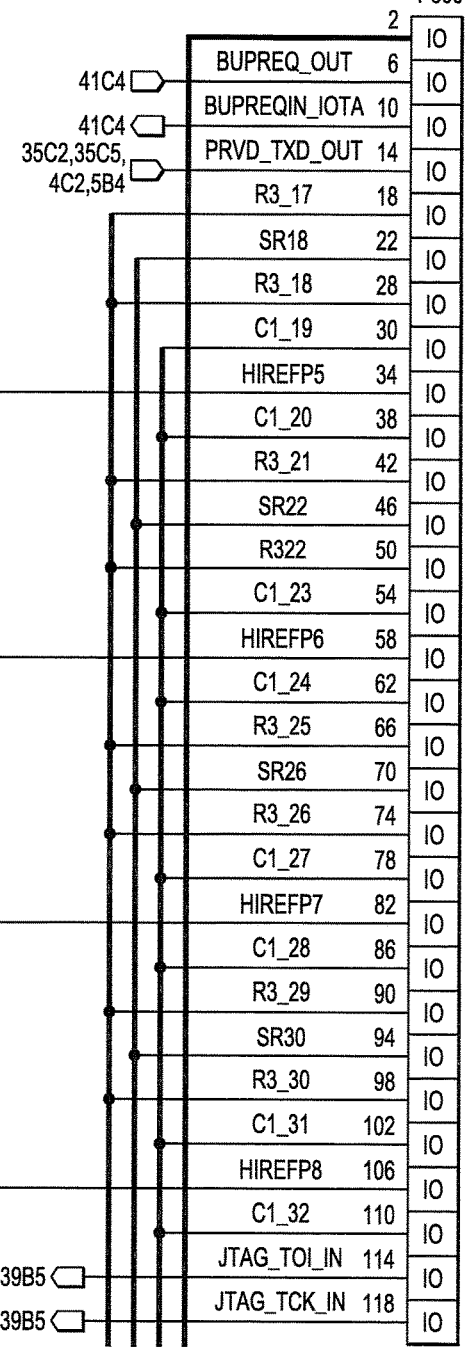
FIG. 6A

LOWER CONNECTOR: 700

| | | | | | | | |
|---|---|---|---|---|---|---|---|
| 1 | GROUND | 2 | EXTRACT_A | 3 | EXTRACT_B | 4 | 24V_SHORT |
| 5 | IOLA_p | 6 | BUPREQ_OUT | 7 | MR_n | 8 | IOLB_p |
| 9 | IOLA_n | 10 | BUPREQ_IN | 11 | 3V3_SENSE_OUT | 12 | IOLB_n |
| 13 | PRVD_RXD | 14 | PRVD_TXD | 15 | DBG_RXD | 16 | DBG_TXD |
| 17 | OUT17 | 18 | R3_17 | 19 | C1_17 | 20 | R2_17 |
| 21 | SR17 | 22 | SR18 | 23 | HIREF ASIC5 | 24 | GROUND |
| 25 | OUT18 | 26 | R3_18 | 27 | C1_18 | 28 | R2_18 |
| 29 | R2_19 | 30 | C1_19 | 31 | R3_19 | 32 | OUT19 |
| 33 | GROUND | 34 | HIREFP ASICS | 35 | SR19 | 36 | SR20 |
| 37 | R2_20 | 38 | C1_20 | 39 | R3_20 | 40 | OUT20 |
| 41 | OUT21 | 42 | R3_21 | 43 | C1_21 | 44 | R2_21 |
| 45 | SR21 | 46 | SR22 | 47 | HIREF ASIC6 | 48 | GROUND |
| 49 | OUT22 | 50 | R3_22 | 51 | C1_22 | 52 | R2_22 |
| 53 | R2_23 | 54 | C1_23 | 55 | R3_23 | 56 | OUT23 |
| 57 | GROUND | 58 | HIREFP ASIC6 | 59 | SR23 | 60 | SR24 |
| 61 | R2_24 | 62 | C1_24 | 63 | R3_24 | 64 | OUT24 |
| 65 | OUT25 | 66 | R3_25 | 67 | C1_25 | 68 | R2_25 |
| 69 | SR25 | 70 | SR26 | 71 | HIREF ASIC7 | 72 | GROUND |
| 73 | OUT26 | 74 | R3_26 | 75 | C1_26 | 76 | R2_26 |
| 77 | R2_27 | 78 | C1_27 | 79 | R3_27 | 80 | OUT27 |
| 81 | GROUND | 82 | HIREFP ASIC7 | 83 | SR27 | 84 | SR28 |
| 85 | R2_28 | 86 | C1_28 | 87 | R3_28 | 88 | OUT28 |
| 89 | OUT29 | 90 | R3_29 | 91 | C1_29 | 92 | R2_29 |
| 93 | SR29 | 94 | SR30 | 95 | HIREF ASIC8 | 96 | GROUND |
| 97 | OUT30 | 98 | R3_30 | 99 | C1_30 | 100 | R2_30 |
| 101 | R2_31 | 102 | C1_31 | 103 | R3_31 | 104 | OUT31 |
| 105 | GROUND | 106 | HIREFP ASIC8 | 107 | SR31 | 108 | SR32 |
| 109 | R2_32 | 110 | C1_32 | 111 | R3_32 | 112 | OUT32 |
| 113 | JTAG_TDO | 114 | JTAG_TDI | 115 | JTAG_TRSTn | 116 | JTAG_TMS |
| 117 | 24VOUT_SHORT | 118 | JTAG_TCK | 119 | EXTRACT_A | 120 | GROUND |

SHORT PIN   MEDIUM PIN   LONG PIN

FIG. 7

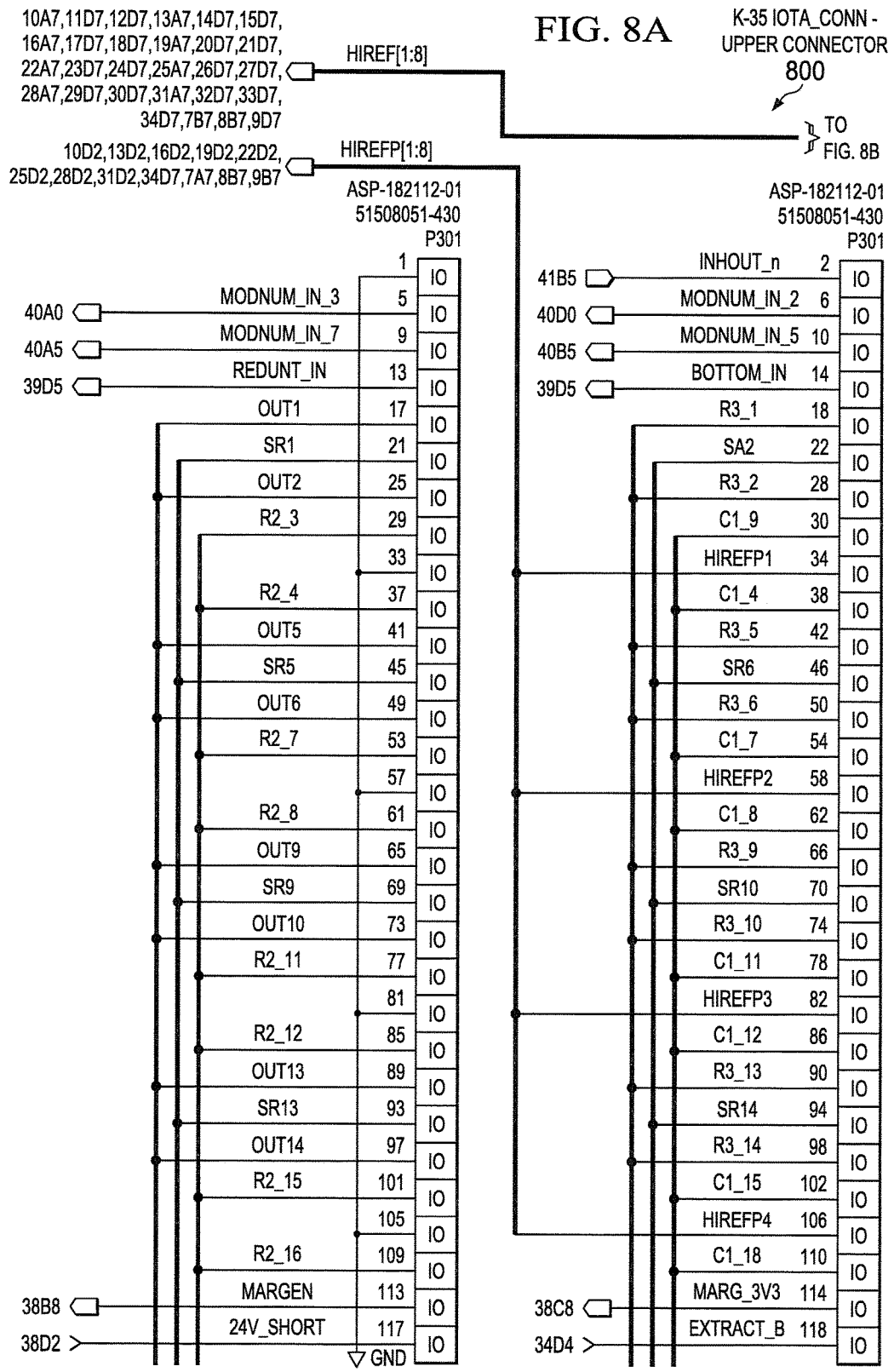

UPPER CONNECTOR:                                           900

| 1 | GROUND | 2 | INHOUT_n | 3 | EXTRACT | 4 | 24VIN_SHORT |
|---|---|---|---|---|---|---|---|
| 5 | MODNUM3 | 6 | MODNUM2 | 7 | MODNUM1 | 8 | MODNUM0 |
| 9 | MODNUM7 | 10 | MODNUM6 | 11 | MODNUM5 | 12 | MODNUM4 |
| 13 | REDUNT | 14 | BOTTOM | 15 | IOTATYPE0 | 16 | INHIN_n |
| 17 | OUT1 | 18 | R3_1 | 19 | C1_1 | 20 | R2_1 |
| 21 | SR1 | 22 | SR2 | 23 | HIREF ASIC1 | 24 | GROUND |
| 25 | OUT2 | 26 | R3_2 | 27 | C1_2 | 28 | R2_2 |
| 29 | R2_3 | 30 | C1_3 | 31 | R3_3 | 32 | OUT3 |
| 33 | GROUND | 34 | HIREFP ASIC1 | 35 | SR3 | 36 | SR4 |
| 37 | R2_4 | 38 | C1_4 | 39 | R3_4 | 40 | OUT4 |
| 41 | OUT5 | 42 | R3_5 | 43 | C1_5 | 44 | R2_5 |
| 45 | SR5 | 46 | SR6 | 47 | HIREF ASIC2 | 48 | GROUND |
| 49 | OUT6 | 50 | R3_6 | 51 | C1_6 | 52 | R2_6 |
| 53 | R2_7 | 54 | C1_7 | 55 | R3_7 | 56 | OUT7 |
| 57 | GROUND | 58 | HIREFP ASIC2 | 59 | SR7 | 60 | SR8 |
| 61 | R2_8 | 62 | C1_8 | 63 | R3_8 | 64 | OUT8 |
| 65 | OUT9 | 66 | R3_9 | 67 | C1_9 | 68 | R2_9 |
| 69 | SR9 | 70 | SR10 | 71 | HIREF ASIC3 | 72 | GROUND |
| 73 | OUT10 | 74 | R3_10 | 75 | C1_10 | 76 | R2_10 |
| 77 | R2_11 | 78 | C1_11 | 79 | R3_11 | 80 | OUT11 |
| 81 | GROUND | 82 | HIREFP ASIC3 | 83 | SR11 | 84 | SR12 |
| 85 | R2_12 | 86 | C1_12 | 87 | R3_12 | 88 | OUT12 |
| 89 | OUT13 | 90 | R3_13 | 91 | C1_13 | 92 | R2_13 |
| 93 | SR13 | 94 | SR14 | 95 | HIREF ASIC4 | 96 | GROUND |
| 97 | OUT14 | 98 | R3_14 | 99 | C1_14 | 100 | R2_14 |
| 101 | R2_15 | 102 | C1_15 | 103 | R3_15 | 104 | OUT15 |
| 105 | GROUND | 106 | HIREFP ASIC4 | 107 | SR15 | 108 | SR16 |
| 109 | R2_16 | 110 | C1_16 | 111 | R3_16 | 112 | OUT16 |
| 113 | MARGEN | 114 | MARG_3V3 | 115 | 24VFLT | 116 | MSTCLR_n |
| 117 | 24V_SHORT | 118 | EXTRACT_B | 119 | 24VFLT | 120 | GROUND |

SHORT PIN   MEDIUM PIN   LONG PIN         FIG. 9

METHOD AND APPARATUS FOR PROVIDING EARLY WARNING OF EXTRACTION OF MODULE UNDER POWER

CROSS-REFERENCE TO RELATED APPLICATION AND PRIORITY CLAIM

This application claims priority under 35 U.S.C. § 119(e) to U.S. Provisional Patent Application No. 62/068,922 filed on Oct. 27, 2014, which is hereby incorporated by reference in its entirety.

TECHNICAL FIELD

This disclosure relates generally to industrial process control and automation systems. More specifically, this disclosure relates to a method and apparatus for providing early warning of the extraction of a module under power.

BACKGROUND

Industrial process control and automation systems are often used to automate large and complex industrial processes. These types of systems routinely include sensors, actuators, and controllers. The controllers typically receive measurements from the sensors and generate control signals for the actuators. Input/output (I/O) modules are often used to support the transport of data between the sensors, controllers, and actuators. In some instances, it is necessary or desirable to remove a component from an industrial process control and automation system. For example, an I/O module may need to be removed from a unit so that it can be replaced with another I/O module.

SUMMARY

This disclosure provides a method and apparatus for providing early warning of the extraction of a module under power.

In a first embodiment, an apparatus includes a connector configured to be electrically coupled to electrical circuitry. The connector has multiple pins, including one or more first pins and one or more second pins. The one or more second pins are longer than the one or more first pins. The apparatus also includes a signal generator configured to (i) detect disconnection of the one or more first pins prior to disconnection of the one or more second pins and (ii) generate a signal in response to detecting the disconnection of the one or more first pins.

In a second embodiment, a method includes detecting a disconnect event associated with a connector that is electrically coupled to electrical circuitry. The connector has multiple pins, including one or more first pins and one or more second pins. The one or more second pins are longer than the one or more first pins. The method also includes generating a signal in response to detecting the disconnect event. The disconnect event is detected in response to disconnection of the one or more first pins prior to disconnection of the one or more second pins.

In a third embodiment, an apparatus includes a connector configured to be electrically coupled to electrical circuitry, where the connector has multiple pins. The apparatus also includes a signal generator configured to (i) detect disconnection of a first subset of the pins prior to disconnection of a second subset of the pins and (ii) generate a signal in response to detecting the disconnection of the first subset of the pins. The connector includes multiple portions. Each portion of the connector is configured to disconnect at least one of the pins while leaving remaining pins connected.

Among other things, this provides a mechanism that can automatically alert active circuitry that a module is being physically removed from a larger system. This early warning can be used to ensure that the active circuitry enters a benign state in a controlled manner while the module is being extracted. Entering this benign state can help to prevent the active circuitry from causing upsets or disruptions to, for example, a larger control system from which the module is being removed.

Other technical features may be readily apparent to one skilled in the art from the following figures, descriptions, and claims.

BRIEF DESCRIPTION OF THE DRAWINGS

For a more complete understanding of this disclosure, reference is now made to the following description, taken in conjunction with the accompanying drawings, in which:

FIGS. 6A through 9 illustrate example lower and upper connectors for coupling a module to a backplane or other structure according to this disclosure;

DETAILED DESCRIPTION

FIGS. 1 through 14, discussed below, and the various embodiments used to describe the principles of the present invention in this patent document are by way of illustration only and should not be construed in any way to limit the scope of the invention. Those skilled in the art will understand that the principles of the invention may be implemented in any type of suitably arranged device or system.

Figure 1:
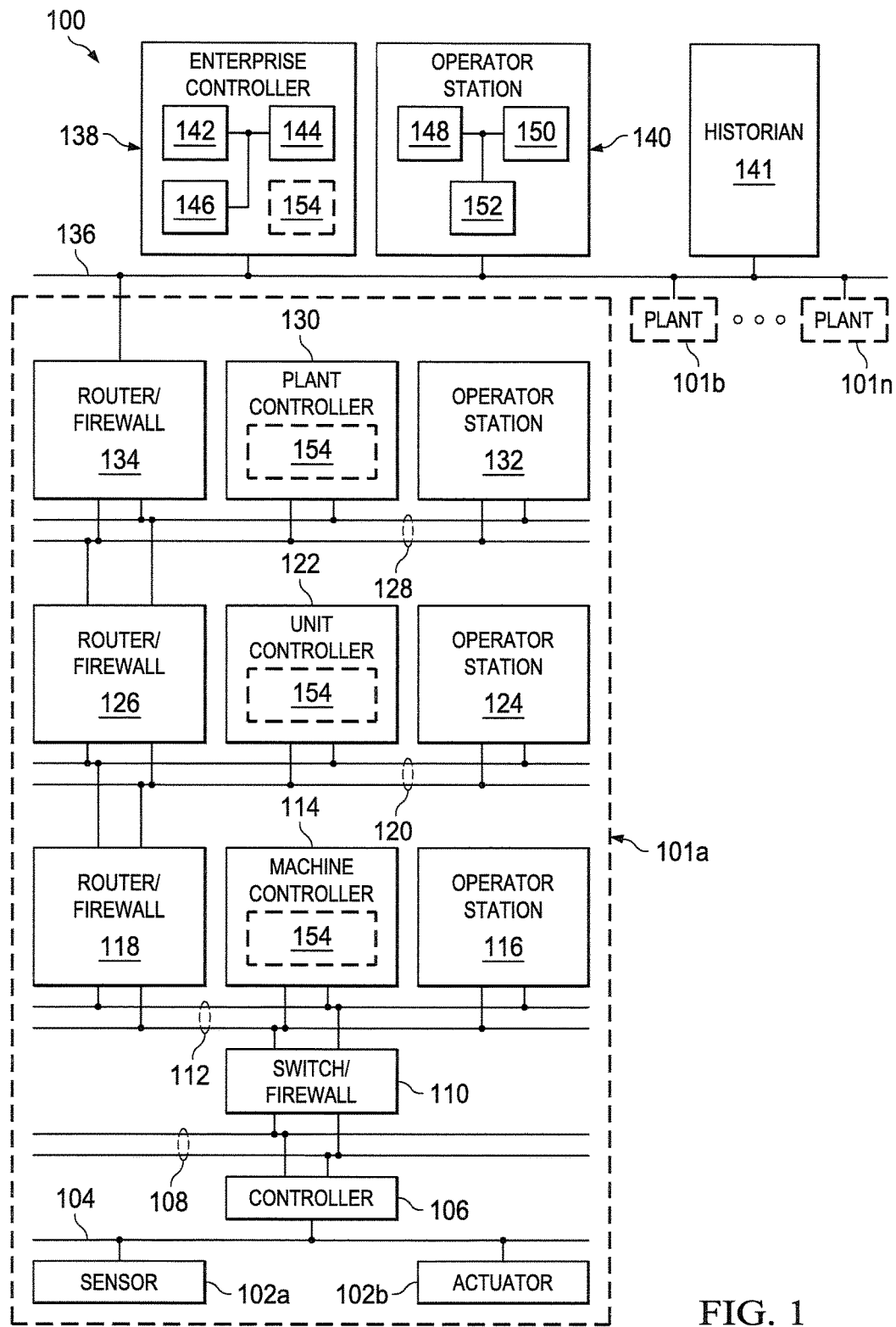
FIG. 1 illustrates an example industrial process control and automation system according to this disclosure.

FIG. 1 illustrates an example industrial process control and automation system 100 according to this disclosure. As shown in FIG. 1, the system 100 includes various components that facilitate production or processing of at least one product or other material. For instance, the system 100 is used here to facilitate control over components in one or multiple plants 101a-101n. Each plant 101a-101n represents one or more processing facilities (or one or more portions thereof), such as one or more manufacturing facilities for producing at least one product or other material. In general, each plant 101a-101n may implement one or more processes and can individually or collectively be referred to as a process system. A process system generally represents any system or portion thereof configured to process one or more products or other materials in some manner.

In FIG. 1, the system 100 is implemented using the Purdue model of process control. In the Purdue model, "Level 0" may include one or more sensors 102a and one or more actuators 102b. The sensors 102a and actuators 102b represent components in a process system that may perform any of a wide variety of functions. For example, the sensors 102a could measure a wide variety of characteristics in the process system, such as temperature, pressure, or flow rate. Also, the actuators 102b could alter a wide variety of characteristics in the process system. The sensors 102a and actuators 102b could represent any other or additional components in any suitable process system. Each of the sensors 102a includes any suitable structure for measuring one or more characteristics in a process system. Each of the actuators 102b includes any suitable structure for operating on or affecting one or more conditions in a process system.

At least one network 104 is coupled to the sensors 102a and actuators 102b. The network 104 facilitates interaction with the sensors 102a and actuators 102b. For example, the network 104 could transport measurement data from the sensors 102a and provide control signals to the actuators 102b. The network 104 could represent any suitable network or combination of networks. As particular examples, the network 104 could represent an Ethernet network, an electrical signal network (such as a HART or FOUNDATION FIELDBUS network), a pneumatic control signal network, or any other or additional type(s) of network(s).

In the Purdue model, "Level 1" may include one or more controllers 106, which are coupled to the network 104. Among other things, each controller 106 may use the measurements from one or more sensors 102a to control the operation of one or more actuators 102b. For example, a controller 106 could receive measurement data from one or more sensors 102a and use the measurement data to generate control signals for one or more actuators 102b. Each controller 106 includes any suitable structure for interacting with one or more sensors 102a and controlling one or more actuators 102b. Each controller 106 could, for example, represent a multivariable controller, such as a Robust Multivariable Predictive Control Technology (RMPCT) controller or other type of controller implementing model predictive control (MPC) or other advanced predictive control (APC). As a particular example, each controller 106 could represent a computing device running a real-time operating system.

Two networks 108 are coupled to the controllers 106. The networks 108 facilitate interaction with the controllers 106, such as by transporting data to and from the controllers 106. The networks 108 could represent any suitable networks or combination of networks. As particular examples, the networks 108 could represent a pair of Ethernet networks or a redundant pair of Ethernet networks, such as a FAULT TOLERANT ETHERNET (FTE) network from HONEYWELL INTERNATIONAL INC.

At least one switch/firewall 110 couples the networks 108 to two networks 112. The switch/firewall 110 may transport traffic from one network to another. The switch/firewall 110 may also block traffic on one network from reaching another network. The switch/firewall 110 includes any suitable structure for providing communication between networks, such as a HONEYWELL CONTROL FIREWALL (CF9) device. The networks 112 could represent any suitable networks, such as a pair of Ethernet networks or an HE network.

In the Purdue model, "Level 2" may include one or more machine-level controllers 114 coupled to the networks 112. The machine-level controllers 114 perform various functions to support the operation and control of the controllers 106, sensors 102a, and actuators 102b, which could be associated with a particular piece of industrial equipment (such as a boiler or other machine). For example, the machine-level controllers 114 could log information collected or generated by the controllers 106, such as measurement data from the sensors 102a or control signals for the actuators 102b. The machine-level controllers 114 could also execute applications that control the operation of the controllers 106, thereby controlling the operation of the actuators 102b. In addition, the machine-level controllers 114 could provide secure access to the controllers 106. Each of the machine-level controllers 114 includes any suitable structure for providing access to, control of, or operations related to a machine or other individual piece of equipment. Each of the machine-level controllers 114 could, for example, represent a server computing device running a MICROSOFT WINDOWS operating system. Although not shown, different machine-level controllers 114 could be used to control different pieces of equipment in a process system (where each piece of equipment is associated with one or more controllers 106, sensors 102a, and actuators 102b).

One or more operator stations 116 are coupled to the networks 112. The operator stations 116 represent computing or communication devices providing user access to the machine-level controllers 114, which could then provide user access to the controllers 106 (and possibly the sensors 102a and actuators 102b). As particular examples, the operator stations 116 could allow users to review the operational history of the sensors 102a and actuators 102b using information collected by the controllers 106 and/or the machine-level controllers 114. The operator stations 116 could also allow the users to adjust the operation of the sensors 102a, actuators 102b, controllers 106, or machine-level controllers 114. In addition, the operator stations 116 could receive and display warnings, alerts, or other messages or displays generated by the controllers 106 or the machine-level controllers 114. Each of the operator stations 116 includes any suitable structure for supporting user access and control of one or more components in the system 100. Each of the operator stations 116 could, for example, represent a computing device running a MICROSOFT WINDOWS operating system.

At least one router/firewall 118 couples the networks 112 to two networks 120. The router/firewall 118 includes any suitable structure for providing communication between networks, such as a secure router or combination router/firewall. The networks 120 could represent any suitable networks, such as a pair of Ethernet networks or an FIE network.

In the Purdue model, "Level 3" may include one or more unit-level controllers 122 coupled to the networks 120. Each unit-level controller 122 is typically associated with a unit in a process system, which represents a collection of different machines operating together to implement at least part of a process. The unit-level controllers 122 perform various functions to support the operation and control of components in the lower levels. For example, the unit-level controllers 122 could log information collected or generated by the components in the lower levels, execute applications that control the components in the lower levels, and provide secure access to the components in the lower levels. Each of the unit-level controllers 122 includes any suitable structure for providing access to, control of, or operations related to one or more machines or other pieces of equipment in a process unit. Each of the unit-level controllers 122 could, for example, represent a server computing device running a MICROSOFT WINDOWS operating system. Although not shown, different unit-level controllers 122 could be used to control different units in a process system (where each unit is associated with one or more machine-level controllers 114, controllers 106, sensors 102a, and actuators 102b).

Access to the unit-level controllers 122 may be provided by one or more operator stations 124. Each of the operator stations 124 includes any suitable structure for supporting user access and control of one or more components in the system 100. Each of the operator stations 124 could, for example, represent a computing device running a MICROSOFT WINDOWS operating system.

At least one router/firewall 126 couples the networks 120 to two networks 128. The router/firewall 126 includes any suitable structure for providing communication between networks, such as a secure router or combination router/firewall. The networks 128 could represent any suitable networks, such as a pair of Ethernet networks or an FTE network.

In the Purdue model, "Level 4" may include one or more plant-level controllers 130 coupled to the networks 128. Each plant-level controller 130 is typically associated with one of the plants 101a-101n, which may include one or more process units that implement the same, similar, or different processes. The plant-level controllers 130 perform various functions to support the operation and control of components in the lower levels. As particular examples, the plant-level controller 130 could execute one or more manufacturing execution system (MES) applications, scheduling applications, or other or additional plant or process control applications. Each of the plant-level controllers 130 includes any suitable structure for providing access to, control of, or operations related to one or more process units in a process plant. Each of the plant-level controllers 130 could, for example, represent a server computing device running a MICROSOFT WINDOWS operating system.

Access to the plant-level controllers 130 may be provided by one or more operator stations 132. Each of the operator stations 132 includes any suitable structure for supporting user access and control of one or more components in the system 100. Each of the operator stations 132 could, for example, represent a computing device running a MICROSOFT WINDOWS operating system.

At least one router/firewall 134 couples the networks 128 to one or more networks 136. The router/firewall 134 includes any suitable structure for providing communication between networks, such as a secure router or combination router/firewall. The network 136 could represent any suitable network, such as an enterprise-wide Ethernet or other network or all or a portion of a larger network (such as the Internet).

In the Purdue model, "Level 5" may include one or more enterprise-level controllers 138 coupled to the network 136. Each enterprise-level controller 138 is typically able to perform planning operations for multiple plants 101a-101n and to control various aspects of the plants 101a-101n. The enterprise-level controllers 138 can also perform various functions to support the operation and control of components in the plants 101a-101n. As particular examples, the enterprise-level controller 138 could execute one or more order processing applications, enterprise resource planning (ERP) applications, advanced planning and scheduling (APS) applications, or any other or additional enterprise control applications. Each of the enterprise-level controllers 138 includes any suitable structure for providing access to, control of, or operations related to the control of one or more plants. Each of the enterprise-level controllers 138 could, for example, represent a server computing device running a MICROSOFT WINDOWS operating system. In this document, the term "enterprise" refers to an organization having one or more plants or other processing facilities to be managed. Note that if a single plant 101a is to be managed, the functionality of the enterprise-level controller 138 could be incorporated into the plant-level controller 130.

Access to the enterprise-level controllers 138 may be provided by one or more operator stations 140. Each of the operator stations 140 includes any suitable structure for supporting user access and control of one or more components in the system 100. Each of the operator stations 140 could, for example, represent a computing device running a MICROSOFT WINDOWS operating system.

Various levels of the Purdue model can include other components, such as one or more databases. The database(s) associated with each level could store any suitable information associated with that level or one or more other levels of the system 100. For example, a historian 141 can be coupled to the network 136. The historian 141 could represent a component that stores various information about the system 100. The historian 141 could, for instance, store information used during production scheduling and optimization. The historian 141 represents any suitable structure for storing and facilitating retrieval of information. Although shown as a single centralized component coupled to the network 136, the historian 141 could be located elsewhere in the system 100, or multiple historians could be distributed in different locations in the system 100.

In particular embodiments, the various controllers and operator stations in FIG. 1 may represent computing devices. For example, each of the controllers could include one or more processing devices 142 and one or more memories 144 for storing instructions and data used, generated, or collected by the processing device(s) 142. Each of the controllers could also include at least one network interface 146, such as one or more Ethernet interfaces or wireless transceivers. Also, each of the operator stations could include one or more processing devices 148 and one or more memories 150 for storing instructions and data used, generated, or collected by the processing device(s) 148. Each of the operator stations could also include at least one network interface 152, such as one or more Ethernet interfaces or wireless transceivers.

As described above, it may become necessary or desirable to remove a component from the industrial process control and automation system 100. For example, an input/output (I/O) module may need to be removed from one of the various controllers in FIG. 1 so that it can be replaced with another I/O module. During the removal of a module, a current control circuit in the module or other component (such as the component from which the module is being removed) could lose connectivity to a sense point used to monitor or control an electrical current. For example, a current control circuit could lose connectivity to a sense point while a transistor in an output channel is being disconnected. As a result, the output electrical current from the module or other component can be negatively affected during this time, such as by increasing or decreasing rapidly. This can cause upsets or disruptions to or within the control and automation system 100.

In a prior approach, a circuit supporting a "secondary means of de-energization" (SMOD) was provided to isolate a faulty channel from remaining circuitry. The SMOD circuit also functioned to effectively handle upsets or disruptions caused when a module was being removed while under power. However, the SMOD circuit included various diodes and transistors to support this functionality, making it a relatively expensive solution to this problem.

In accordance with this disclosure, disruptions or upsets to an active control system can be reduced or prevented by facilitating the transition of electrical circuitry (such as in a module that is being removed from a system) to a benign state, which occurs prior to the interruption of power to that circuitry. As described in more detail below, a module could include a multilevel connector that is configured to be electrically coupled to electrical circuitry. The connector includes multiple pins, including one or more shorter first pins and one or more longer second pins. The connector also includes an early warning pulse generator (EWPG) configured to generate a signal in response to detecting disconnection of the one or more first pins prior to disconnection of the one or more second pins. The signal can be transmitted to the electrical circuitry before the disengagement of the one or more second pins. In this way, the electrical circuitry can enter a benign state in a controlled manner while the module is being extracted. Ideally, this reduces or prevents rapidly increasing or decreasing currents or other transients from causing upsets or disruptions to or within the control and automation system 100. Additional details regarding the use of a connector in this manner are provided below.

Although FIG. 1 illustrates one example of an industrial process control and automation system 100, various changes may be made to FIG. 1. For example, a control system could include any number of sensors, actuators, controllers, servers, operator stations, networks, and multilevel connectors. Also, the makeup and arrangement of the system 100 in FIG. 1 is for illustration only. Components could be added, omitted, combined, or placed in any other suitable configuration according to particular needs. Further, particular functions have been described as being performed by particular components of the system 100. This is for illustration only. In general, process control systems are highly configurable and can be configured in any suitable manner according to particular needs. In addition, FIG. 1 illustrates an example environment in which early warning signal generation can be used. This functionality can be used in any other suitable device or system.

Figure 2:
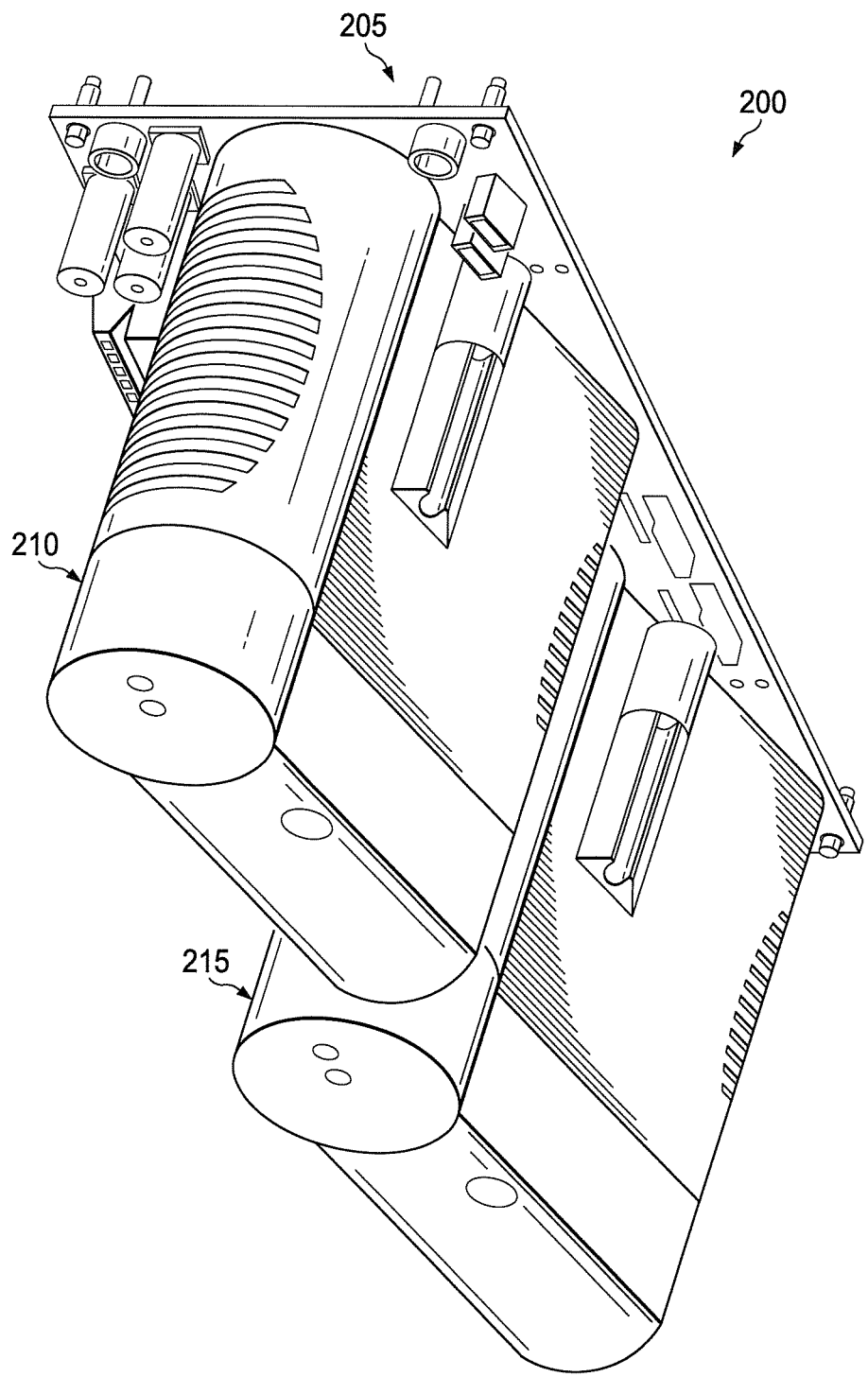
FIG. 2 illustrates an example controller and circuit board system according to this disclosure.

FIG. 2 illustrates an example module and circuit board system 200 according to this disclosure. The system 200 shown here could, for example, be used in various controllers or other components shown in FIG. 1. However, the system 200 could be used in any other suitable system.

As shown in FIG. 2, the system 200 includes a circuit board 205 and one or more modules 210-215. The circuit board 205 generally represents any suitable substrate on which electrical traces and circuit components can be formed or disposed. The circuit board 205 also includes components for electrically coupling the circuit board 205 to the modules 210-215, such as a backplane and connectors for coupling to corresponding connectors on the modules 210-215.

Each module 210-215 includes electrical circuitry for providing one or more desired functions. For example, each module 210-215 could represent an I/O module providing input/output functionality or a controller module providing control functionality (on any suitable level of a control system), although any other type(s) of module(s) could be used here. Each module 210-215 also includes components for electrically coupling to the circuit board 205, such as connectors for coupling to the corresponding connectors on the circuit board 205.

As described in more detail below, the connectors used to couple the circuit board 205 and the modules 210-215 represent multilevel connectors having pins of different lengths. Disengagement of one or more shorter pins could be detected prior to disengagement of one or more longer pins, allowing a signal to be generated in the circuit board 205 and/or in the modules 210-215. The signal allows appropriate action to be taken to reduce or prevent upsets or disruptions to or within the control and automation system 100.

Although FIG. 2 illustrates one example of a module and circuit board system 200, various changes may be made to FIG. 2. For example, while shown as having a single circuit board with two modules, a system could include any number of modules mounted to any number of circuit boards. Also, the form factors of the various components shown here is for illustration only.

Figure 3:
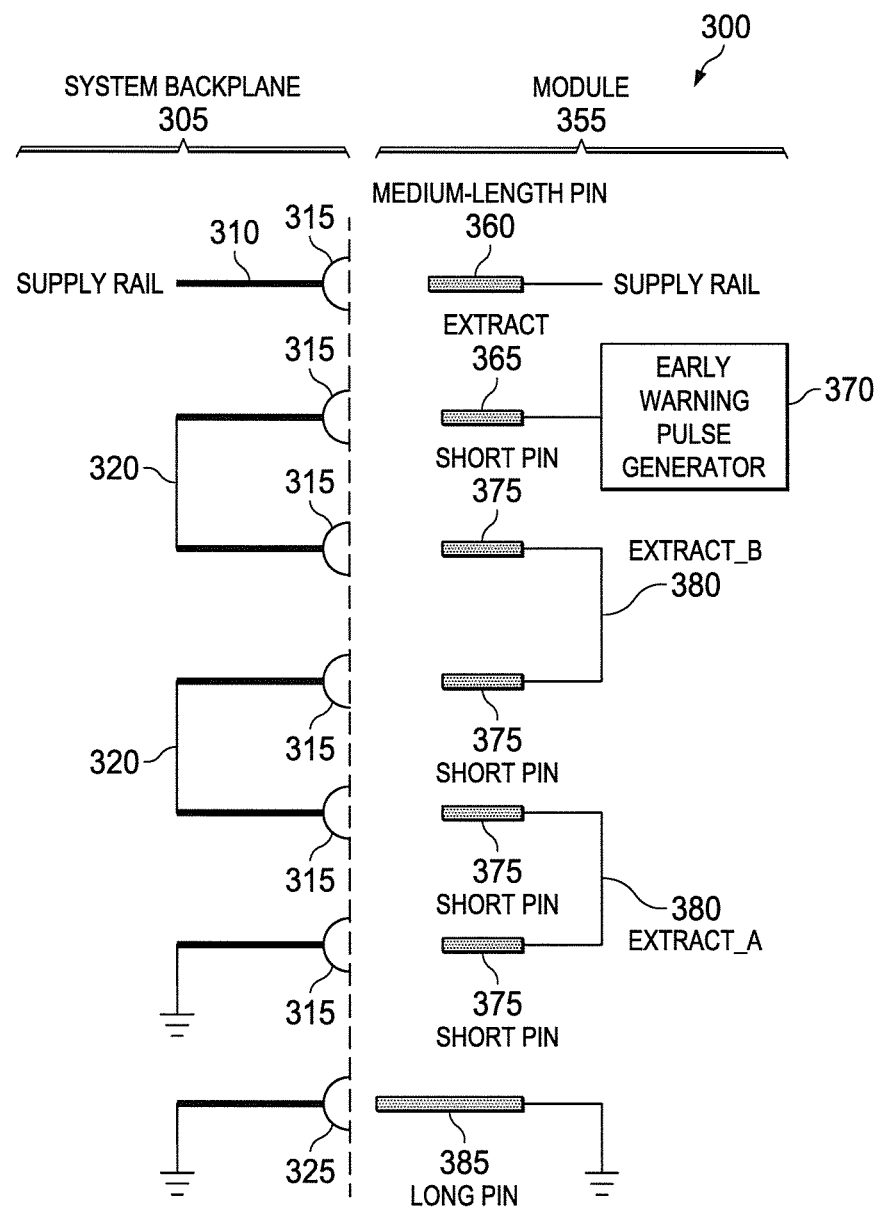
FIG. 3 illustrates an example pin configuration used with an input/output (I/O) module or other module according to this disclosure.

FIG. 3 illustrates an example pin configuration 300 used with an I/O module or other module according to this disclosure. In this particular example, the pin configuration 300 is shown as being used to couple a system backplane 305 and a module 355, such as in the module and circuit board system 200 of FIG. 2. However, the pin configuration 300 could be used in any other suitable connectors and in any other suitable system.

As shown in FIG. 3, the system backplane 305 includes a supply rail pin receiver 310, one or more short pin receivers 315, and one or more long pin receivers 325. One or more of the short pin receivers 315 and one or more of the long pin receivers 325 can be coupled to ground. Two or more short pin receivers 315 can also be linked together via linkages 320.

The module 355 includes a supply rail pin 360, which is coupled to a supply rail. When the supply rail pin 360 is inserted into the supply rail pin receiver 310, electrical power can be supplied to the module 355 from the backplane 305. In some embodiments, the supply rail pin 360 could represent a medium-length pin, meaning it is longer than some pins and shorter than other pins in the pin configuration 300.

The module 355 also includes one or more short pins 365, 375 and one or more long pins 385. The long pin 385 shown here is coupled to ground. When the long pin 385 is inserted into the long pin receiver 325, the module 355 is electrically coupled to ground via the backplane 305.

The short pins 365, 375 here can be inserted into the short pin receivers 315 of the backplane 305. The short pin 365 is coupled to an early warning pulse generator (EWPG) 370, and various short pins 375 are coupled to one another via linkages 380. As shown in FIG. 3, the pins 365 and 375, the pin receivers 315, and the linkages 320 and 380 form an electrical path between the EWPG 370 and ground when the module 355 is connected to the backplane 305.

The EWPG 370 uses this electrical path to detect when the module 355 is being disconnected from the backplane 305. For example, when the module 355 initially begins to be pulled away from the backplane 305, at least one short pin 365 or 375 is separated from its associated pin receiver 315. The EWPG 370 can then detect that a path to ground is no longer available through the pin 365 and treat this as a disconnect event. As a particular example, the EWPG 370 could detect that current no longer flows through the pin 365 to ground. In response, the EWPG 370 can generate at least one pulse or other signal. This signal can be used by other circuitry within the module 355 to shut down the circuitry or otherwise place the circuitry into a benign state. The EWPG 370 represents any suitable circuitry that generates at least one pulse or other signal in response to detecting a disconnect event.

The arrangement in FIG. 3 generally creates a "daisy chain" configuration of the short pins, short pin receivers, and linkages. This configuration therefore forms an elongated electrical path that traces back and forth between the backplane 305 and the module 355. This electrical path is broken any time one or more of the short pins 365, 375 are removed from their corresponding short pin receivers 315. In some embodiments, the module 355 can be removed unevenly from the backplane 305, meaning not all short pins are removed simultaneously from their corresponding short pin receivers. As an example, the top short pin 365 or the bottom short pin 375 might be removed first during disconnection. In particular embodiments, the elongated electrical path could span across all or a substantial portion of the connector between the backplane 305 and the module 355, which allows a disconnect event to be detected regardless of which short pin(s) might be removed first.

Note that because the supply rail pin 360 and the long pin 385 are longer than the short pins 365, 375, the module 355 ideally continues to receive power for a short period of time after a disconnect event begins. In this way, the EWPG 370 becomes active or generates an early warning signal in advance of any loss of power to the module 355. In other words, the EWPG 370 can continue to operate while the module 355 is in the process of being physically removed from a larger system. This also allows other circuitry to receive the early warning signal from the EWPG 370 and take suitable action. The pin arrangement 300 here therefore uses a combination of pins of shorter length(s) and longer length(s) to support the detection of disconnect events while still allowing power to be supplied (albeit temporarily) during the disconnect events.

As noted above, the supply rail pin 360 could be longer than the short pins 365, 375 but shorter than the long pin 385 coupled to ground. This allows a disconnect event to be detected when at least one short pin 365, 375 is removed from its pin receiver 315. During this time, a supply voltage continues to be provided to the module 355 via the supply rail pin 360. Moreover, the long pin 385 coupled to ground may be longer than the supply rail pin 360 to help ensure that the ground connection of the module 355 is the last connection broken during module extraction. Since the shorter pins are used to generate the early warning signal, the early warning signal can be recognized by the module prior to other connector pins (such as the supply and ground pins) becoming disengaged. However, the pins 360 and 385 could have any suitable equal or unequal lengths, as long as each pin 360 and 385 is longer than one or more pins used for disconnect event detection.

Note that the arrangement of pins in FIG. 3 is for illustration only and that any suitable arrangement of shorter and longer pins could be used. For example, the longer and shorter pins could be connected in an alternating (interwoven) pattern between the module 355 and the backplane 305.

Although FIG. 3 illustrates one example of a pin configuration 300 used with an I/O module or other module, various changes may be made to FIG. 3. For example, the EWPG 370 could be located in the backplane 305 and used to generate early warning signals for circuitry on or coupled to the backplane 305. The EWPG 370 could also be located in the backplane 305 and coupled to both a shorter pin and a longer pin of the module 355, where the shorter pin is used for disconnect event detection and the longer pin is used to provide an early warning signal to the module 355. Also, any number of short, medium, and long pins could be used with the pin configuration 300. In addition, the early warning signal generation functionality described here could be used with any other suitable pin configuration. In addition, the pins and pin receivers could be reversed, with the backplane 305 containing the pins and the module 355 containing the pin receivers.

Figure 4:
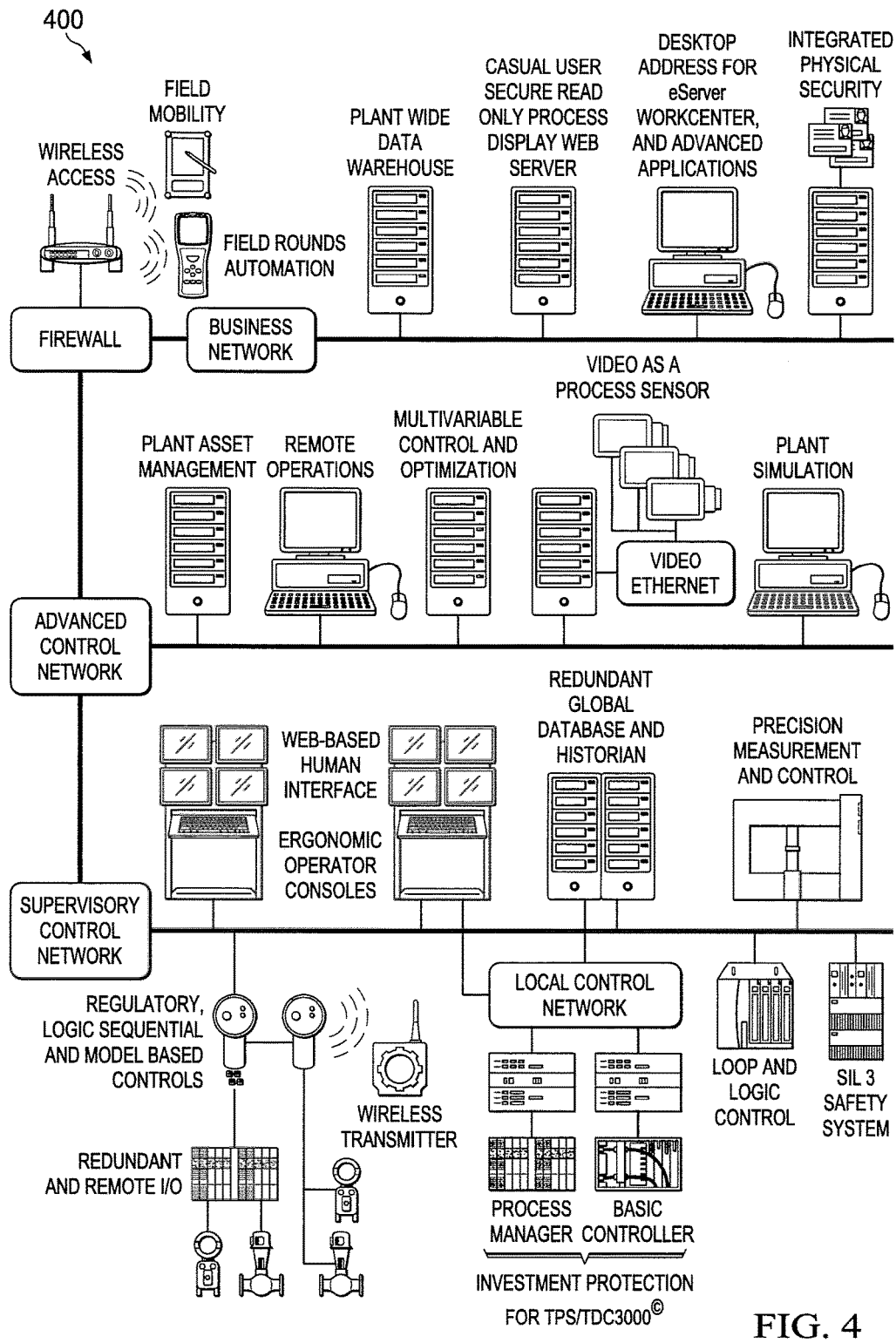
FIG. 4 illustrates an example system in which early warning signal generation could be used according to this disclosure.

FIG. 4 illustrates an example system 400 in which early warning signal generation could be used according to this disclosure. The system 400 here includes various EXPERION devices, FAULT TOLERANT ETHERNET (HE) networks, and SERIES C controllers, input/output (I/O) modules, and other devices from HONEYWELL INTERNATIONAL INC. The SERIES C I/O modules could use the early warning signal generation functionality described above. Note, however, that the early warning signal generation functionality could be used in any other suitable system.

Figure 5:
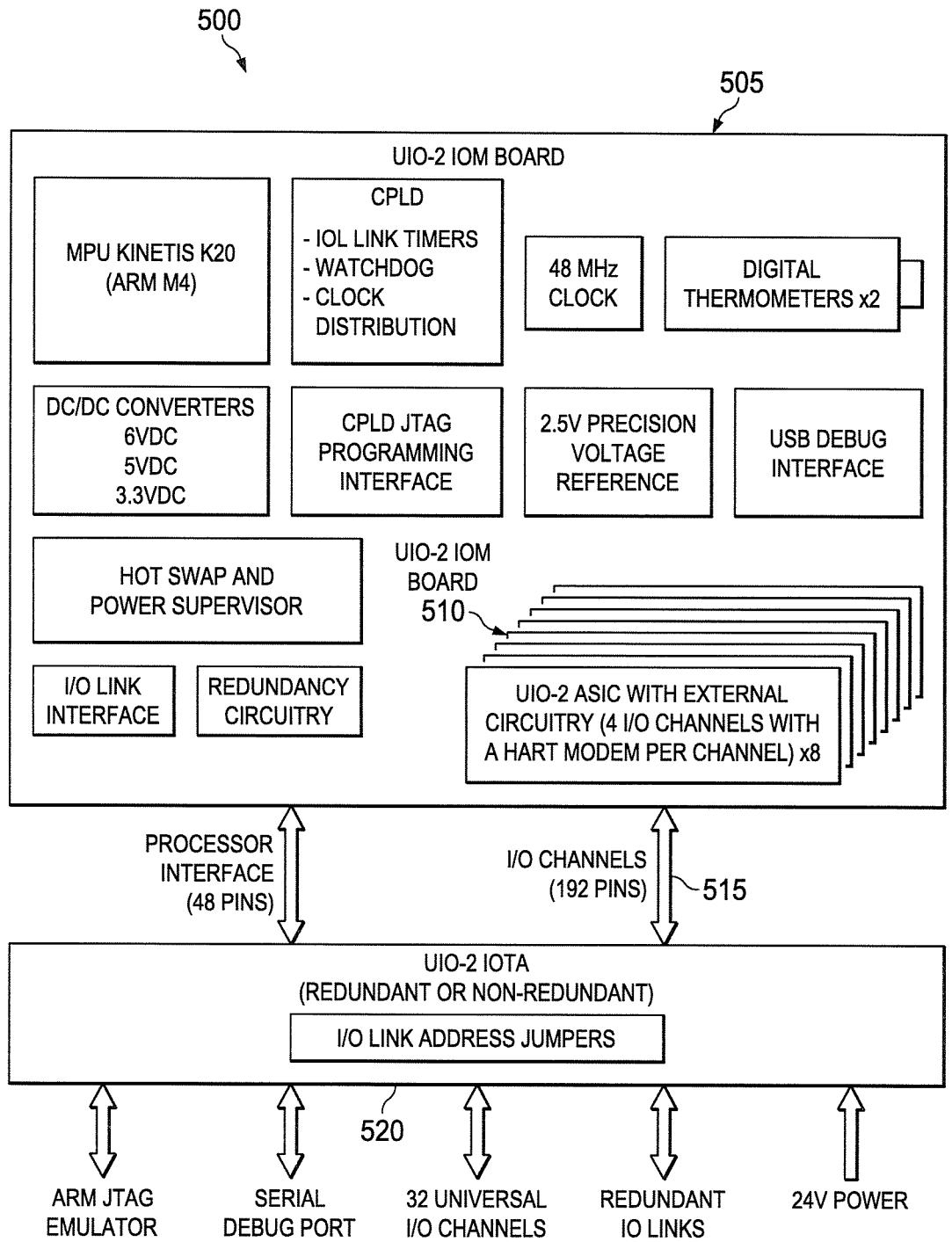
FIG. 5 illustrates an example system including an I/O module in which early warning signal generation could be used according to this disclosure.

FIG. 5 illustrates an example system 500 including an I/O module 505 in which early warning signal generation could be used according to this disclosure. As shown in FIG. 5, the I/O module 505 is coupled via one or more pins 515 to a circuit board 520. When an early warning signal is initiated as discussed above, a reset pulse or other signal is sent to one or more application specific integrated circuit (ASIC) units 510 before complete disengagement between the module 505 and the circuit board 520. This allows the ASIC units 510 to reset, enter a benign state, or take other suitable action to reduce or avoid disruptions or upsets in a control and automation system. Note, however, that the early warning signal generation functionality could be used in any other suitable system. Also, note that while the ASIC units 510 are described here as using the early warning signal, any other suitable electrical circuitry within a module or backplane could use an early warning signal.

FIGS. 6A through 9 illustrate example lower and upper connectors for coupling a module to a backplane or other structure according to this disclosure. In particular, FIGS. 6A, 6B, and 7 relate to one portion of an example connector, while FIGS. 8A, 8B, and 9 relate to another portion of the example connector. The different portions could be coupled to a module (such as a remote terminal unit or "RTU") and a backplane, although the portions of the connector could be used to couple any suitable module or other device to any suitable structure.

Figure 6B:
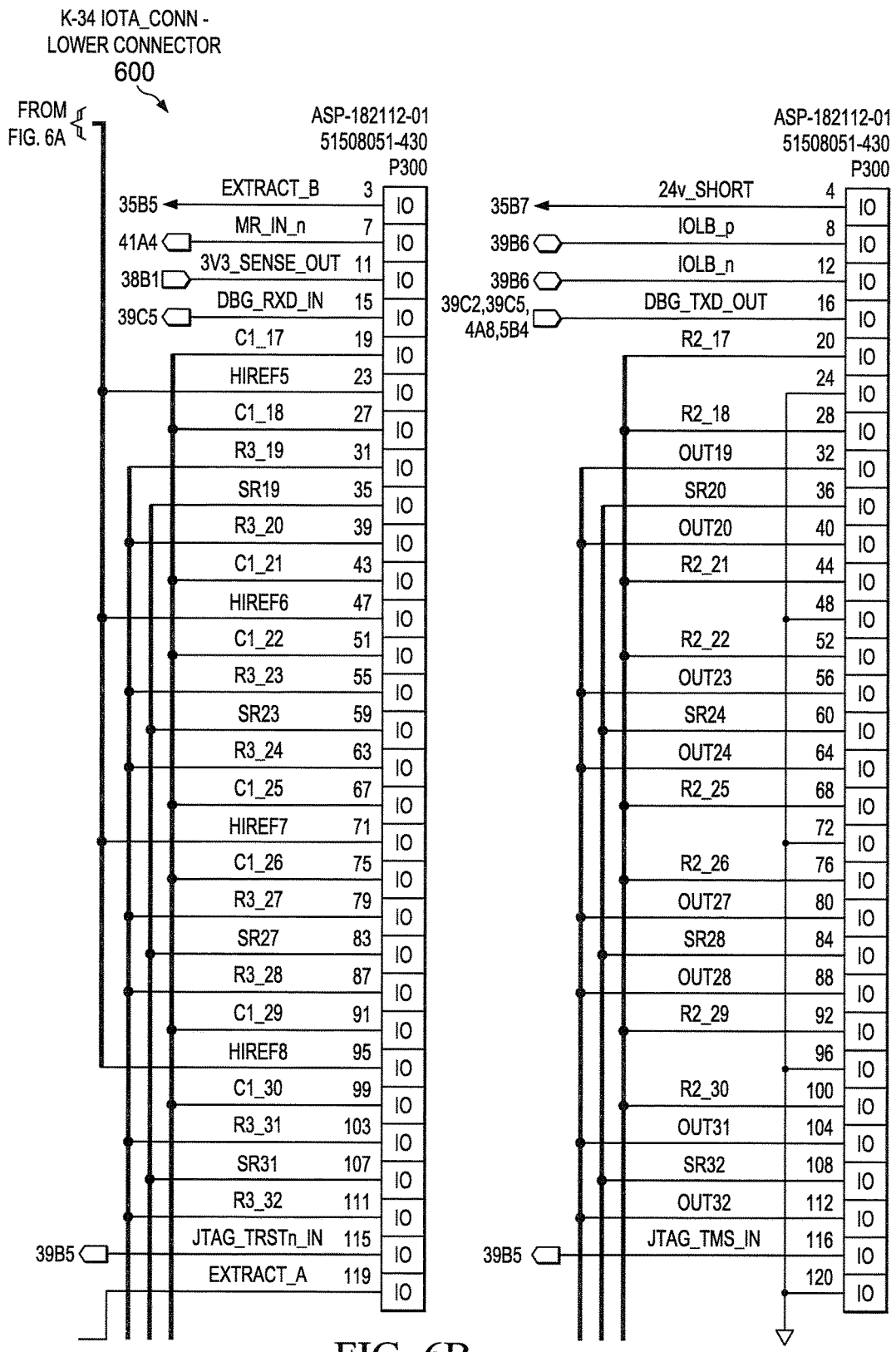
Figure 8B:
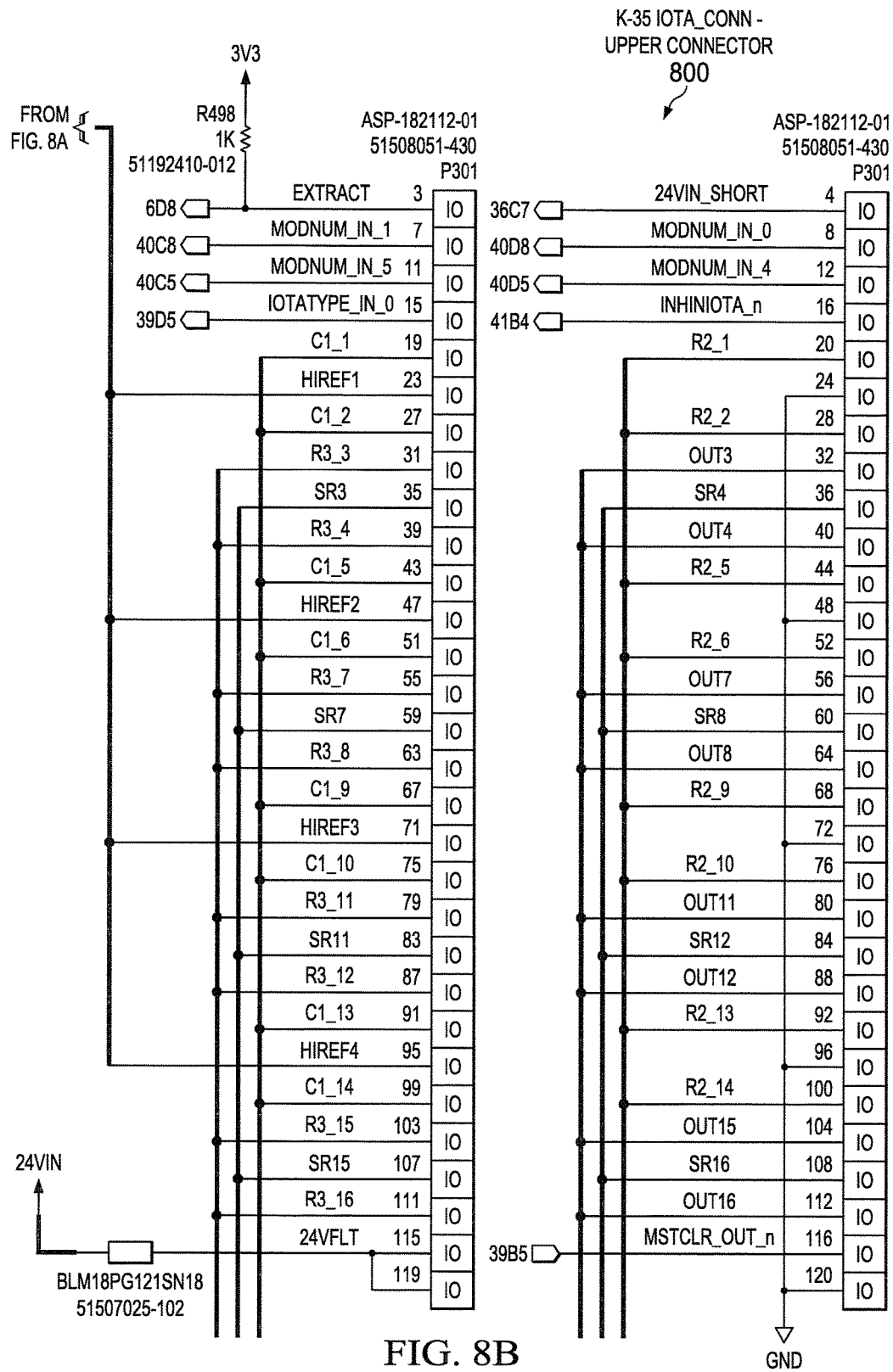

FIGS. 6A and 6B illustrate an example connector diagram 600 for a portion of a connector. FIG. 7 illustrates an example pin configuration 700 that can be used in the connector diagram 600 of FIGS. 6A and 6B. FIGS. 8A and 8B illustrate an example connector diagram 800 for another portion of the connector. FIG. 9 illustrates an example pin configuration 900 that can be used in the connector diagram 800 of FIGS. 8A and 8B.

Note that the connector diagrams 600, 800 and the pin configurations 700, 900 shown here are specific examples only. Other connectors and other pin configurations could also be used.

Figure 10:
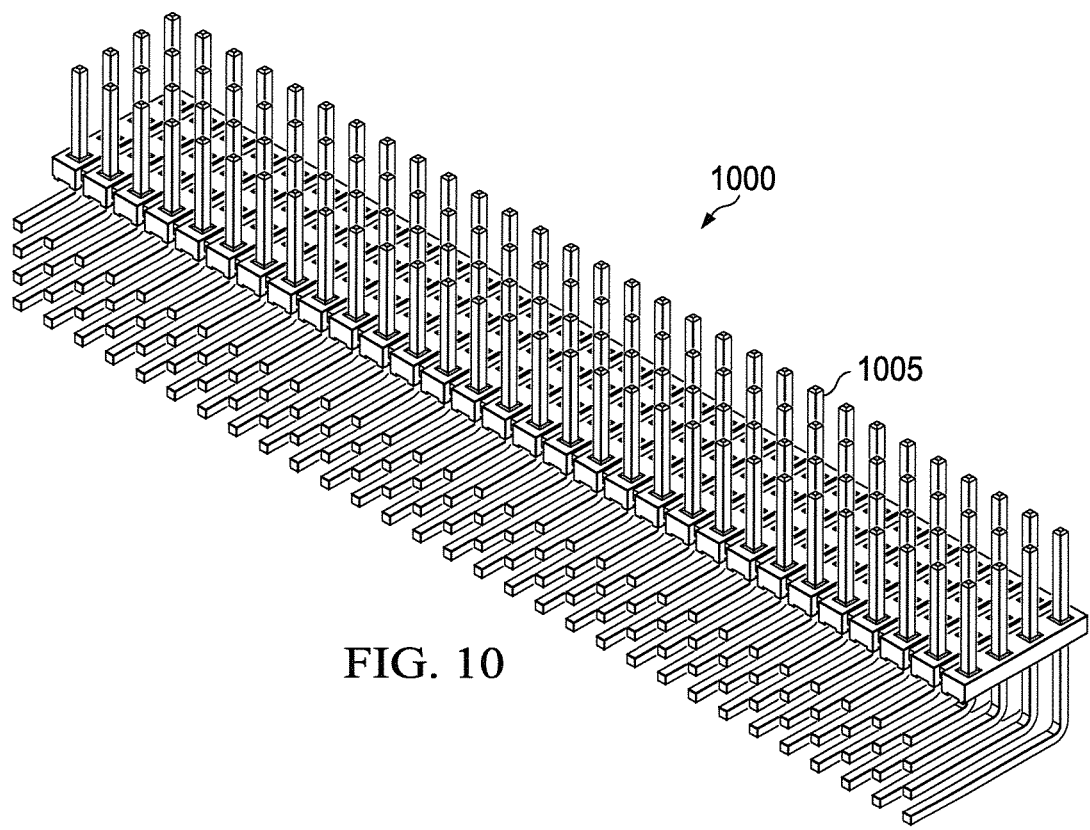
FIGS. 10 through 13 illustrate other example pin configurations used with early warning signal generation according to this disclosure.
Figure 11:
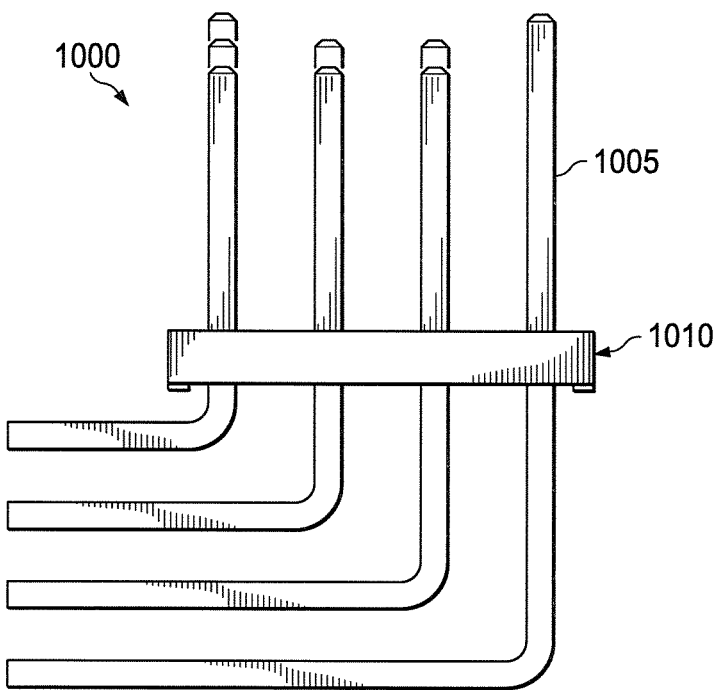

FIGS. 10 through 13 illustrate other example pin configurations used with early warning signal generation according to this disclosure. As shown in FIGS. 10 and 11, a pin configuration 1000 includes various pins 1005 that are secured within a holder 1010. Similar to the pins illustrated in FIG. 3, the pins 1005 can be used to electrically connect a module to a backplane or form any other suitable electrical connection. Moreover, the pins 1005 include shorter pins and longer pins so that, when a module (such as the module 355) begins to disengage, the pins 1005 disconnect in a staggered sequence. This can be detected and used to generate an early warning signal as described above.

Figure 12:
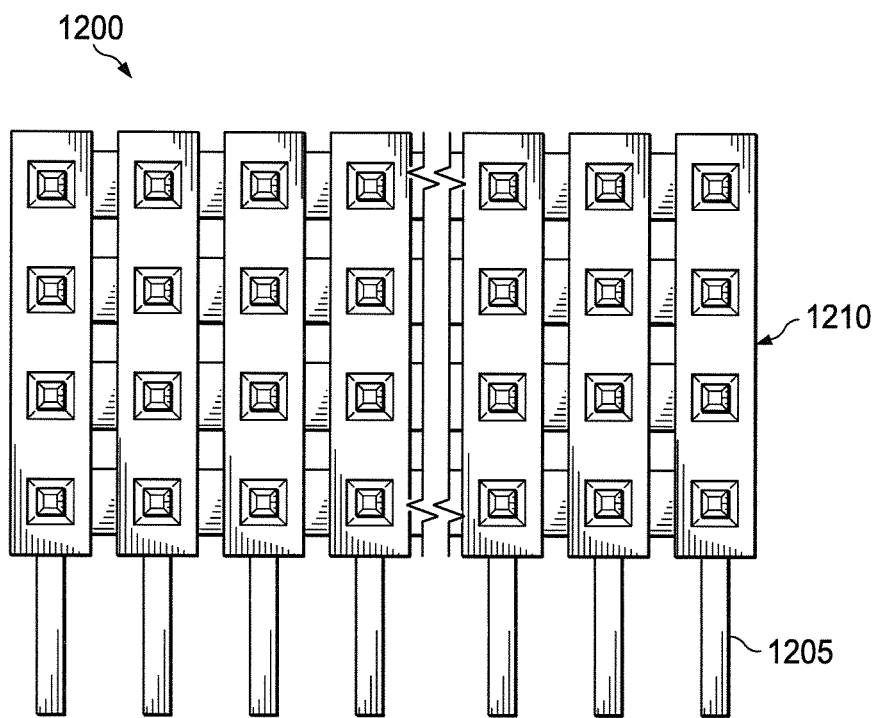
Figure 13:
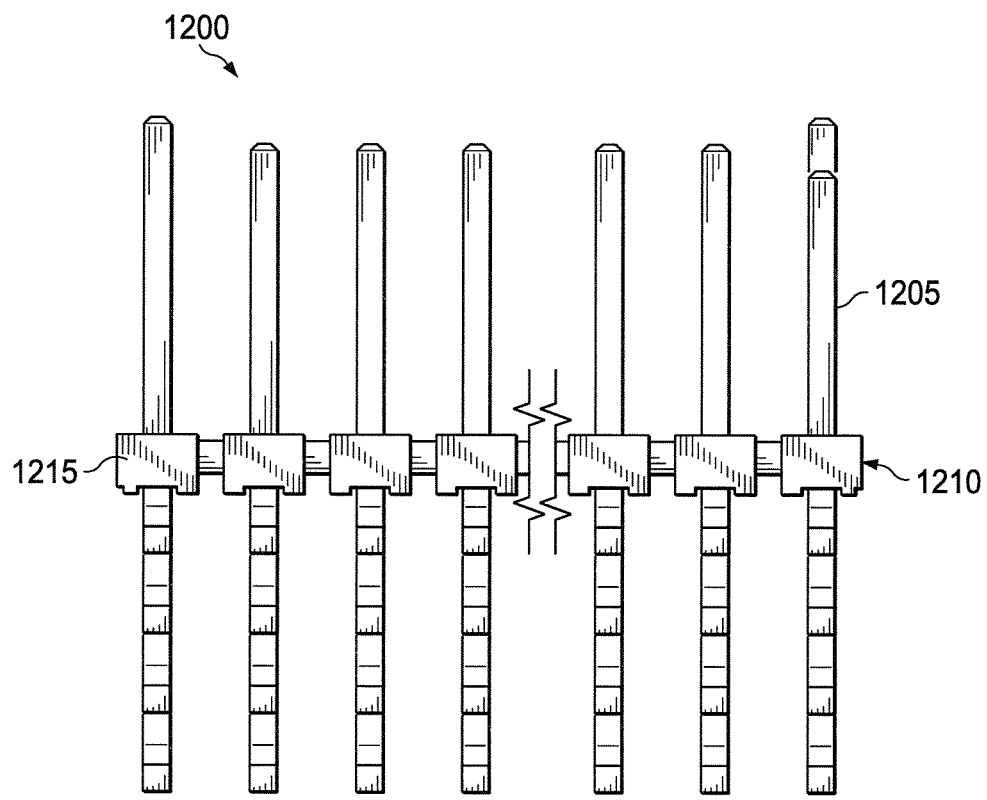

As shown in FIGS. 12 and 13, a pin configuration 1200 includes various pins 1205 that are secured within a holder 1210. Here, the holder 1210 is divided into multiple connected portions 1215. As the holder 1210 is removed during a disconnect event, some pins disengage while remaining pins stay connected, for example because the holder 1210 is removed at an angle from the electronic circuit board so that each pin disconnects at different times or slightly different times. More specifically, the pins connected to the portions 1215 could disconnect before the pins connected to the portions 1215 disconnect. Note that in this embodiment, the pins may or may not have different lengths.

Figure 14:
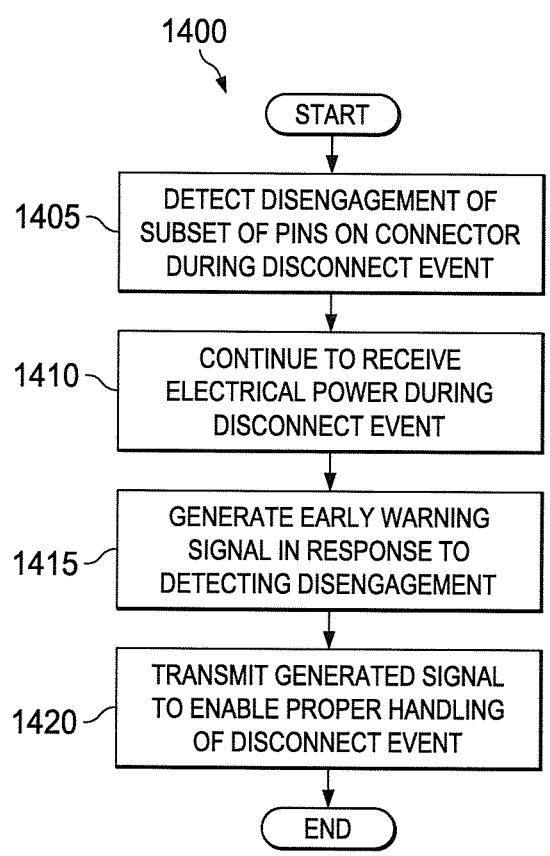
FIG. 14 illustrates an example method for providing early warning of the extraction of a module under power according to this disclosure.

FIG. 14 illustrates an example method 1400 for providing early warning of the extraction of a module under power according to this disclosure. As shown in FIG. 14, a disengagement of a subset of pins on a connector is detected at step 1405. This could include, for example, the EWPG 370 detecting that an electrical path through a module 355 and a backplane 305 to ground has broken. Note that a "subset" refers to any one or more elements (but not all elements) in a collection of elements.

Electrical power continues to be received during the disconnect event at step 1410. This could include, for example, the pins 360 and 385 continuing to provide an electrical path for the module 355 to receive electrical power from the backplane 305, at least for a short period of time.

An early warning signal is generated in response to the disengagement at step 1415. This could include, for example, the EWPG 370 generating one or more pulses using the electrical power still being received through the connector. The early warning signal is transmitted, such as to external circuitry, to enable proper handling of the disconnect event at step 1420. This could include, for example, the EWPG 370 transmitting the pulse(s) to electrical circuitry within the module 355 or within the backplane 305 (via a longer pin) to prepare the electrical circuitry for the removal. This can occur while the electrical power is still being supplied via the pins 360, 385 so that the electrical circuitry within the module 305 could take suitable protective action, such as resetting the ASIC units 510 or otherwise placing circuitry into a benign state.

Although FIG. 14 illustrates one example of a method 1400 for providing early warning of the extraction of a module under power, various changes may be made to FIG. 14. For example, while shown as a series of steps, various steps in FIG. 14 could overlap, occur in parallel, occur in a different order, or occur any number of times.

It may be advantageous to set forth definitions of certain words and phrases used throughout this patent document. The term "couple" and its derivatives refer to any direct or indirect communication between two or more elements, whether or not those elements are in physical contact with one another. The terms "transmit," "receive," and "communicate," as well as derivatives thereof, encompass both direct and indirect communication. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. An apparatus comprising:
a connector configured to be electrically coupled to electrical circuitry, the connector comprising:
multiple pins including (i) ground pins configured to be electrically connected to ground and (ii) one or more supply pins, the one or more supply pins longer than the ground pins, the ground pins including a first ground pin and a second ground pin; and
a signal generator coupled to the first ground pin and configured to:
detect, through the first ground pin, disconnection of the second ground pin from a second short pin receiver while both (i) the first ground pin remains connected to a first short pin receiver and (ii) the one or more supply pins remain connected to one or more long pin receivers; and
generate a signal in response to detecting the disconnection of the second ground pin from the second short pin receiver.

2. The apparatus of claim 1, wherein the connector further comprises one or more third pins that are longer than the one or more supply pins.

3. The apparatus of claim 2, wherein:
the ground pins are configured to create an electrical path from the signal generator to ground;
the one or more supply pins are configured to provide a supply voltage to the electrical circuitry; and
the one or more third pins are configured to electrically couple the electrical circuitry to ground.

4. The apparatus of claim 3, wherein the one or more supply pins and the one or more third pins are configured to remain electrically connected to the electrical circuitry in order to temporarily supply electrical power to the electrical circuitry after the disconnection of the second ground pin from the second short pin receiver.

5. The apparatus of claim 2, wherein:
the one or more supply pins comprise multiple supply pins; and
the one or more third pins comprise multiple third pins.

6. The apparatus of claim 5, wherein the ground pins are configured to create an electrical path that repeatedly travels to and from a module containing the electrical circuitry.

7. The apparatus of claim 5, wherein the ground pins, supply pins, and third pins are interleaved in the connector.

8. The apparatus of claim 1, wherein the signal generator is configured to generate one or more pulses in response to detecting the disconnection of the second ground pin from the second short pin receiver.

9. A method comprising:
detecting, by a signal generator coupled to a first ground pin, a disconnect event associated with a connector that is electrically coupled to electrical circuitry, the connector comprising multiple pins including (i) the first ground pin and a second ground pin configured to be electrically connected to ground and (ii) one or more supply pins, the one or more supply pins longer than the ground pins; and generating, by the signal generator, a signal in response to detecting the disconnect event;

wherein the disconnect event is detected by the signal generator through the first ground pin in response to disconnection of the second ground pin from a second short pin receiver while both (i) the first ground pin remains connected to a first short pin receiver and (ii) the one or more supply pins remain connected to one or more long pin receivers.

10. The method of claim 9, wherein the connector further comprises one or more third pins that are longer than the one or more supply pins.

11. The method of claim 10, wherein:
the ground pins create an electrical path to ground, the electrical path used to detect the disconnect event;
the one or more supply pins provide a supply voltage to the electrical circuitry; and
the one or more third pins electrically couple the electrical circuitry to ground.

12. The method of claim 11, wherein the one or more supply pins and the one or more third pins remain electrically connected to the electrical circuitry in order to temporarily supply electrical power to the electrical circuitry after the disconnection of the second ground pin from the second short pin receiver.

13. The method of claim 10, wherein:
the one or more supply pins comprise multiple supply pins; and
the one or more third pins comprise multiple third pins.

14. The method of claim 13, wherein the ground pins create an electrical path that repeatedly travels to and from a module containing the electrical circuitry, the electrical path used to detect the disconnect event.

15. The method of claim 13, wherein the ground pins, supply pins, and third pins are interleaved in the connector.

16. The method of claim 9, wherein generating the signal comprises generating one or more pulses in response to detecting the disconnection of the second ground pin from the second short pin receiver.

17. The method of claim 9, further comprising:
resetting the electrical circuitry in response to the signal.

18. The method of claim 9, further comprising:
disconnecting a module containing the electrical circuitry without disrupting an industrial process control and automation system.

19. An apparatus comprising:
a connector configured to be electrically coupled to electrical circuitry, the connector comprising multiple pins including first and second ground pins; and
a signal generator coupled to the first ground pin and configured to:
detect, through the first ground pin, a disconnection of the second ground pin from a second short pin receiver while both (i) the first ground pin remains connected to a first short pin receiver and (ii) a supply subset of the pins remain connected to one or more long pin receivers; and
generate a signal in response to detecting the disconnection of the second ground pin from the second ground pin receiver;
wherein the connector comprises multiple portions, each portion of the connector configured to disconnect at least one of the pins while leaving remaining pins connected.

20. The apparatus of claim 19, wherein:
the multiple portions of the connector are physically coupled to each other; and
each portion of the connector holds at least one of the pins.

21. The apparatus of claim 1, wherein:
the first ground pin is configured to couple to the first short pin receiver in a system backplane;
the second ground pin is configured to couple to the second short pin receiver in the system backplane;
a third ground pin is configured to couple to a third short pin receiver in the system backplane;
the first short pin receiver and the third short pin receiver are connected in the system backplane; and
the second short pin receiver is connected to ground in the system backplane.

* * * * *